United States Patent
Kono et al.

(10) Patent No.: US 7,119,362 B2
(45) Date of Patent: Oct. 10, 2006

(54) METHOD OF MANUFACTURING SEMICONDUCTOR APPARATUS

(75) Inventors: Ryuji Kono, Chiyoda (JP); Makoto Kitano, Tsuchiura (JP); Hideo Miura, Koshigaya (JP); Hiroyuki Ota, Tsuchiura (JP); Yoshishige Endo, Tsuchiura (JP); Takeshi Harada, Abiko (JP); Masatoshi Kanamaru, Miho (JP); Teruhisa Akashi, Ishioka (JP); Atsushi Hosogane, Iwama (JP); Akihiko Ariga, Musashimurayama (JP); Naoto Ban, Sagamihara (JP)

(73) Assignee: Renesas Technology Corp., Tokyo (JP)

(*) Notice: Subject to any disclaimer, the term of this patent is extended or adjusted under 35 U.S.C. 154(b) by 150 days.

(21) Appl. No.: 10/326,663

(22) Filed: Dec. 23, 2002

(65) Prior Publication Data

US 2003/0092206 A1 May 15, 2003

Related U.S. Application Data

(63) Continuation of application No. 09/646,511, filed as application No. PCT/JP99/01366 on Mar. 18, 1999, now Pat. No. 6,511,857.

(30) Foreign Application Priority Data

Mar. 19, 1998 (JP) ................. 10-069786

(51) Int. Cl.
*H01L 23/58* (2006.01)
(52) U.S. Cl. ................. 257/48; 257/E23.078; 324/757
(58) Field of Classification Search ................ 257/750, 257/692, 48; 361/776; 324/754–758, 760–770; 700/1; 428/615–620
See application file for complete search history.

(56) References Cited

U.S. PATENT DOCUMENTS

| 5,408,190 | A | * | 4/1995 | Wood et al. ................. 324/765 |
| 5,679,977 | A | * | 10/1997 | Khandros et al. ........... 257/692 |
| 5,917,707 | A | * | 6/1999 | Khandros et al. ........... 361/776 |
| 5,931,685 | A | * | 8/1999 | Hembree et al. ............. 439/74 |
| 5,986,459 | A | * | 11/1999 | Fukaya et al. .............. 324/755 |
| 6,072,323 | A | * | 6/2000 | Hembree et al. ........... 324/755 |
| 6,242,803 | B1 | * | 6/2001 | Khandros et al. ........... 257/750 |
| 6,245,444 | B1 | * | 6/2001 | Marcus et al. .............. 428/616 |
| 6,573,743 | B1 | * | 6/2003 | Sato .......................... 324/765 |

FOREIGN PATENT DOCUMENTS

| JP | 1-147374 | 6/1989 |
| JP | 5-243344 | 9/1993 |
| JP | 6-123746 | 5/1994 |
| JP | 6-213930 | 8/1994 |
| JP | 6-230030 | 8/1994 |
| JP | 7-7052 | 1/1995 |
| JP | 8-50146 | 2/1996 |
| JP | 8-148533 | 6/1996 |
| JP | 9-148389 | 6/1997 |
| JP | 9-243663 | 9/1997 |

* cited by examiner

Primary Examiner—Michael Lebentritt
Assistant Examiner—Andre' Stevenson
(74) Attorney, Agent, or Firm—Antonelli, Terry, Stout and Kraus, LLP.

(57) ABSTRACT

In an electric characteristic testing process corresponding to a process of the semiconductor apparatus manufacturing processes, in order to test a large area of the electrode pad of the body to be tested in a lump, an electric characteristic testing is performed by pressing a testing structure provided with electrically independent projections having a number equal to a number of conductor portions to be tested formed on an area to be tested of a body to be tested to the body to be tested.

11 Claims, 9 Drawing Sheets

METHOD OF MANUFACTURING SEMICONDUCTOR APPARATUS

This application is a Continuation application of application Ser. No. 09/646,511, filed Jan. 12, 2001 now U.S. Pat. No. 6,511,857, the contents of which are incorporated herein by reference in their entirety, Ser. No. 09/646,511 being a national stage application under 35 USC 371 of International (PCT) Application No. PCT/JP99/01366, filed Mar. 18, 1999.

TECHNICAL FIELD

The present invention relates to a method of manufacturing a semiconductor apparatus, and more particularly, to a method of manufacturing a semiconductor apparatus which intends to improve a yield of the semiconductor apparatus by improving a test process.

A conventional semiconductor apparatus has been manufactured in accordance with the following processes.

Device forming process for forming a multiplicity of devices on a wafer

Probing test process for applying a probing test (a continuity test) to a multiplicity of devices formed on the wafer (a subject to be tested)

Dicing process for dicing the wafer (cutting the wafer at every integrated circuits) after the probing test process is finished so as to form a plurality of chips Package process for packaging each of the chips as a semiconductor apparatus Burn-in test process for applying a burn-in test (a thermal load test) to the semiconductor apparatus (a subject to be tested)

In this case, among the processes mentioned above, the subject to be tested in the probing test and the burn-in test, an external test system and a connecting method are basically the same. That is, there is employed a method of mechanically contacting each of conductive fine probes with each of electrode pads patterned on the subject to be test at a pitch of about some tens to a hundred and some tens μm, having a length and a width of some tens to a hundred and some tens μm and a thickness of about 1 μm and made of an aluminum alloy or the other alloys. As the fine probe, for example, there is employed a narrow probe made of a tungsten (W) or a nickel (Ni) and having a diameter of a tip of some tens μm and a length of some tens mm.

DISCLOSURE OF THE INVENTION

However, in the probe structure in accordance with the prior art mentioned above, a large area is required for accurately positioning each of the probes so as to fix. Accordingly, it is hard to arrange more probes within the surface, so that a number of the electrode pads and a number of the chips which can be tested at one time have been limited.

Then, techniques for solving the problems mentioned above are disclosed, for example, in Japanese Patent Unexamined Publication No. 1-147374, Japanese Patent Unexamined Publication No. 9-148389, Japanese Patent Unexamined Publication No. 9-243663 and the like.

In Japanese Patent Unexamined Publication No. 1-147374, the structure is made such that a plurality of beam structures are formed on a single Si single crystal flat plate in a direction of a main plane, a projection is formed in each of tips thereof, and a conductor layer is formed in a direction of a fixed end of the beam structure from the projection.

In Japanese Patent Unexamined Publication No. 9-148389, the structure is made such that Si substrate having three layers formed in different shapes are laminated, a piezoelectric component is arranged on the lowermost layer near a plurality of beam structures and the fixed end of each of the beam structures, and conducting means for conducting the tip of the beam structure with an open surface on the uppermost layer is provided.

In Japanese Patent Unexamined Publication No. 9-243663, an elastomer is interposed between a Si substrate having an aggregate of projections conducting with an external portion and a fixed plate.

However, in Japanese Patent Unexamined Publication No. 1-147374, since a terminal end (an electrode) of a wire within the Si substrate is always formed on substantially the same surface as a probe (projection) forming surface within the Si substrate, there is a problem that the subject to be tested is interfered when performing an electric connection forward from the electrode.

Further, in Japanese Patent Unexamined Publication No. 9-148389, since it is necessary to provide the piezoelectric component in the middle of the beam structure, there is a great problem in view of a cost and a yield in the case of forming a multiplicity of probes.

Still further, in Japanese Patent Unexamined Publication No. 9-243663, the elastomer is directly provided on the back surface of the Si substrate in the structure of the test structure, however, a through groove is always formed in the periphery of each of the beams in the case that the beam structure is provided, so that there is a possibility that it flows out to a side of the subject to be tested due to a pressure at a time of pressing. Further, there is a possibility that the Si substrate weakened by an etching due to a lot of load necessary at a time of testing the subject to be tested in a lump is broken.

An object of the present invention is to make it possible to test an electrode pad of a wafer in a large area and in a lump, in an electric characteristic testing process corresponding to a process of semiconductor apparatus manufacturing processes.

In order to achieve the object mentioned above, in accordance with the present invention, there is provided a method of manufacturing a semiconductor apparatus comprising:

a device forming process for forming a multiplicity of devices on a wafer;

a probing test process for applying a probing test to the wafer (a subject to be tested) on which the multiplicity of devices are formed; and a burn-in test process for applying a burn-in test to the wafer 8 (a subject to be tested) on which the multiplicity of devices are formed, wherein the structure is made as follows.

(1) In the probing test process and/or the burn-in test process, a conductive projection is provided on a main surface, and there is included a process for pressing the projection of a test structure in which the projection and a pad provided on a surface opposite to the main surface are electrically connected to a desired position of the subject to be tested.

(2) In the item (1), the test structure is provided with a conductive projection on a main surface, and there are provided a first plate member in which the projection and the pad provided on the surface opposite to the main surface are electrically connected, a second plate member arranged on the side of a surface forming the pad of the first plate member and in which the pad and a wire formed on the second plate member are electrically connected, and a third plate member arranged between the first plate member and the second plate member, formed by a material having a Young's modulus of 60 GPa or more and having a thickness of 100 μm or more.

(3) In the item (3), a number of test conductor portions formed on the surface opposite to the first plate member of the wafer and a number of the projections formed in the first plate member formed in an electrically independent manner are equal to each other.

(4) In the item (2) or (3), a plurality of the projections are present and a through groove crossing over a straight line connecting adjacent two projections is provided in the first plate member.

(5) In any one of the items (2) to (4), a space is present between the projection and the third plate member.

(6) In any one of the items (1) to (5), a plurality of the first plate members are provided within a substantially the same plane.

(7) In any one of the items (1) to (6), a part other than the projection of the first plate member or all the area and the subject to be tested are in contact when pressing the projection at a desired position of the subject to be tested.

The inventors of the present application have searched a known art on the basis of the result of the present invention. As a result, Japanese Patent Unexamined Publication No. 5-243344, Japanese Patent Unexamined Publication No. 6-123746, Japanese Patent Unexamined Publication No. 7-7052 and Japanese Patent Unexamined Publication No. 8-148553 are listed up. However, none of them describes the present invention as mentioned below.

In Japanese Patent Unexamined Publication No. 5-243344, there is disclosed a structure in which a plurality of metal projections are formed on a thin and flexible thin film, that is, a membrane by using a plating technology and the like and each of them is formed as a probe, in order to make it possible to obtain a denser probe arrangement. However, since each of the probes is arranged and formed by newly piling up a plating on the surface of the flat membrane or attaching a conductive projection, a dispersion tends to be generated in a height of each of the probes, so that it is hard to bring a multiplicity of probes into the electrode pad of the subject to be tested in a lump. Further, in the probe formed by the method of piling up the plating, a shape of the surface of the projection is substantially formed in a spherical surface shape in many cases and a large surface is going to be brought into contact with the subject to be tested, so that a great load is required for the purpose that one projection and the electrode pad are conductive. Further, in the method of forming the plating within a plating mold previously formed at a high accuracy and having a sharp tip shape and forming an accurate projection obtained by removing the plating mold as a probe, a dispersion of an initial height can be reduced, however, a plastic deformation is easily generated since a load is concentrated in the sharpened tip portion. Accordingly, the shape of the tip is blunted due to a repeated use and it is hard to use for a long time. As a result, it is necessary to frequently replace the probe, so that a test cost is increased.

In Japanese Patent Unexamined Publication No. 6-123746, there is disclosed a structure in which a notch is formed in a base material (a card) by setting a synthetic resin and a metal as a base material so as to form a probe which can elastically deforms independently. However, since the base material for forming the probe is a synthetic resin and a metal, there is a great difference of coefficient of thermal expansion with respect to Si corresponding to the material of the subject to be tested. Accordingly, when forming the probe corresponding to the large subject to be tested such as all the area of the wafer or the like, there is a disadvantage that a position shift is generated in an inner direction on the base material and the wafer surface due to a temperature variation for a testing environment. Further, in the case of forming the present structure by a synthetic resin, since a general minimum working size is greater than an electrode pad forming rule for the subject to be tested, it is hard to form the structure itself in correspondence to the subject to be tested. In addition, in order that each of the probes is conductive with the electrode pad, it is necessary to apply a predetermined load in accordance with a shape of the probe, a material and the like, however, since a low elastic body such as a synthetic resin does not have a rigidity capable of generating the load, it is hard to conduct. For example, even when the load can be generated by designing a size of the formed notch and the like, it can be obtained as a result of applying an excessive tensile strain to the synthetic resin. Accordingly, a permanent strain is generated in the synthetic resin after one pressing, so that a desired load can not be generated at the later pressing time. Further, it is not actual to form the base material by a metal since it is hard to form the notch itself in correspondence to the electrode pad forming rule for the subject to be tested.

In Japanese Patent Unexamined Publication No. 7-7052, there is disclosed a structure in which a plurality of structures constituted by beams, projections and metal skin films are formed by setting Si or a metal as a base material so as to form each of the projections as a probe. However, in accordance with this method, since in the projection at a portion near a center of the Si substrate, that is, at a portion apart from an outer side surface of the Si substrate, it is necessary to form a wire to an outer peripheral side surface of the Si substrate with keeping away from the projection at the portion nearer the outer side surface of the Si substrate and the following wire, in the case that a multiplicity of projections are formed, lengths of the wires in correspondence to the respective projections are not aligned as well as a layout for wiring becomes hard, so that there is a disadvantage that it is impossible to obtain a wire impedance matching necessary for measuring an electric characteristic.

In Japanese Patent Unexamined Publication No. 8-148553, there is disclosed a structure in which a wire is provided by setting Si as a base material and an anisotropic conducting film as a probe and the wire is communicated with a back surface of the base material from a through hole. However, since a testing substrate made of Si and a wafer corresponding to the subject to be tested are electrically connected by using the anisotoropic conducting film having a relatively high resistance in place of the plating as the probe, at first, it is necessary to apply a great pressing load in order to perform an electric connection at a resistance equal to or less than a necessary predetermined value. Next, when applying the great pressing load as mentioned above to a finely working probe corresponding to a size of the electrode pad of the subject to be tested, a conductor (in many cases, a metal powder) within the anisotropic conducting film escapes in a direction perpendicular to a pressing direction, so that the resistance is further increased. As a result, there is a disadvantage that a stable electric connection can not be obtained.

BEST MODE FOR CARRYING OUT THE INVENTION

Hereinafter, an embodiment in accordance with the present invention will be described below with reference to the accompanying drawings.

Figure 10:
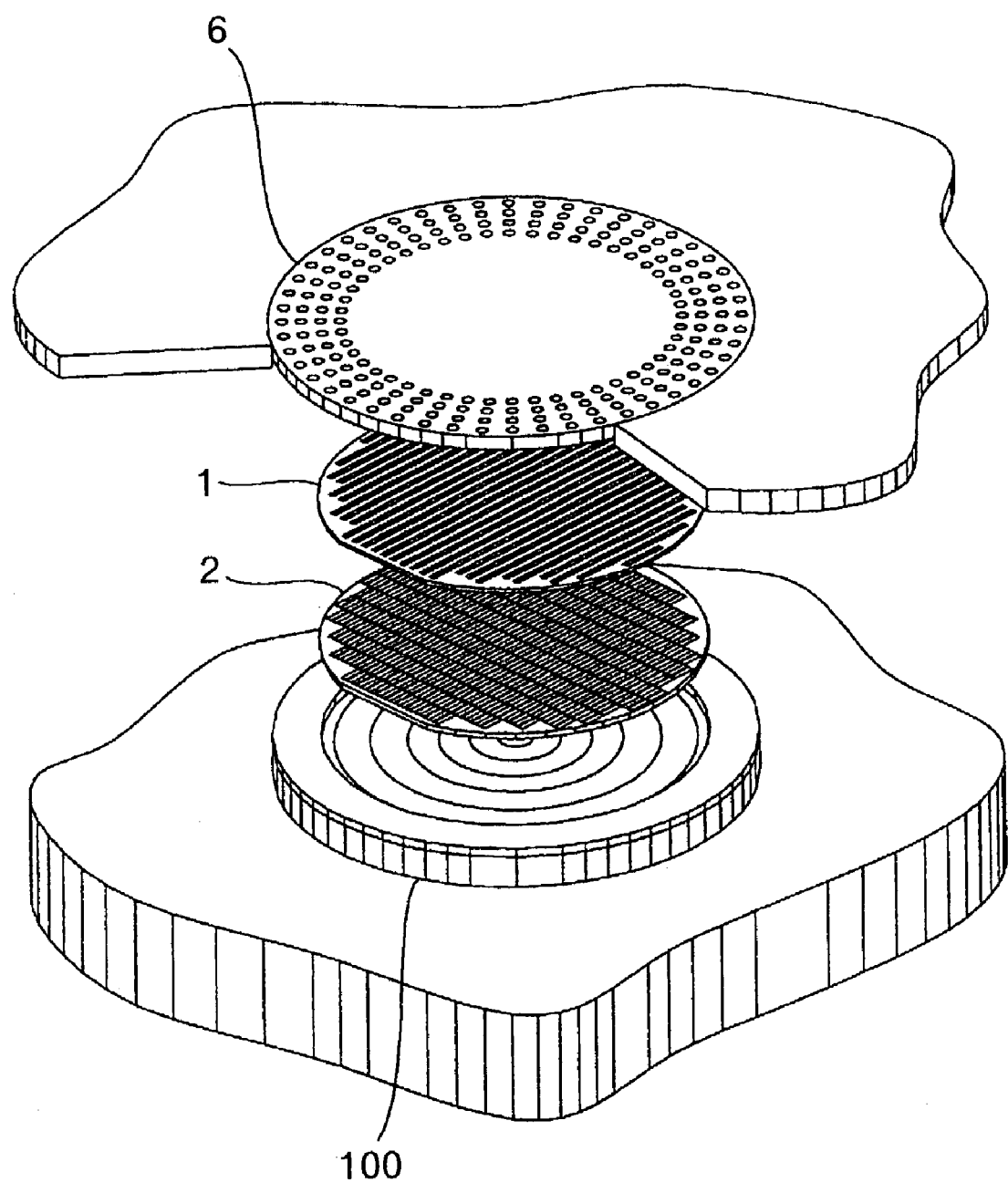
FIG. 10 is a schematic exploded view which shows a part of a main body portion of a test system used in a probing test process in accordance with an embodiment of the present invention.

FIG. 10 is a schematic exploded view which shows a part of a main body portion of a test system used in a probing test process in accordance with the present invention. In the present test system, there are installed a heating apparatus for heating a wafer 2 to be tested and a vacuum adsorption apparatus for fixing the wafer 2, and there is provided a wafer stage 100 having a drive mechanism for controlling a relative distance between the wafer and a test structure. The wafer is mounted and fixed on the wafer stage 100 so that surfaces opposite to the tested surface are faced, and is normally heated and controlled at a temperature of about 90 to 120° C. The test structure is attached to an upper portion of the wafer in a vertical direction by mechanically fixing a second plate member 6 to the present test system. At this time, as a matter of course, the test structure is directed so that a first plate member 1 is directly faced to the tested wafer. In this case, the first plate member 1 and the second plate member 6 are mechanically integrated by a predetermined method in detail described below before being attached to the test system.

The first plate member 1 is formed by setting Si having an outer diameter substantially equal to or more than that of the wafer 2 as a base material. This is because of the purpose for making it possible to form a probe corresponding to positions of all electrode pads to be tested within all area of the wafer, as a result it makes it possible to press, that is, test all the wafer in a lump.

The present probing test process is performed by relatively approaching and contacting both of the wafer and the test structure and pressing them until a predetermined pressing amount after positioning the wafer fixed to the test system and the test structure with respect to the corresponding electrode pad and projection.

With respect to the wafer 2 after finishing the probing test process in this manner, it is judged by a tester whether good or bad an LSI circuit conduction is at every chips among them. The results thereof are used as a data for judging whether or not a conduction correction at each of the chips is required, whether or not it is necessary to apply a predetermined load to each of the chips in a next burn-in process and whether or not it is necessary to return a result of the burn-in process.

In this case, a method of manufacturing a semiconductor apparatus in accordance with the present embodiment includes the following processes.

Device forming process for forming a multiplicity of devices on a wafer

Probing test process for applying a probing test (a continuity test) to a wafer on which a plurality of devices are formed Burn-in test process for applying a burn-in test (a thermal load test) to the wafer on which a plurality of devices are formed Hereinafter, each of the processes will be in detail described below.

[Device Forming Process]

The device formation is performed with respect to the wafer in which a surface thereof is mirror finished after slicing a single crystal Si ingot thin through a multiplicity of unit processes at every specification of devices to be manufactured. A detailed description thereof will be omitted, however, for example, in the case of a popular C-MOS (complementary Metal Oxide Semiconductor), it is formed after passing through a P-type and N-type wafer substrate forming process, a device separating process, a gate forming process, a source/drain forming process, a wiring process, a protective film forming process and the like, in a rough classification.

Figure 8:
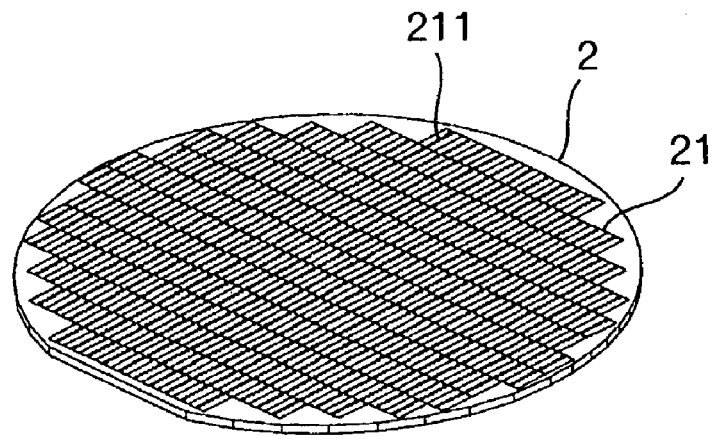
FIG. 8 is a schematic view of an outer appearance of a wafer in accordance with an embodiment of the present invention.
Figure 9:
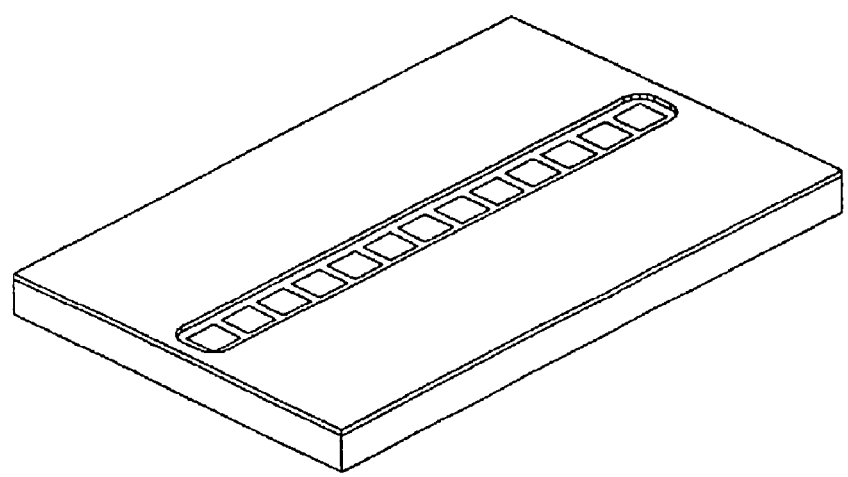
FIG. 9 is a schematic view of an outer appearance of a wafer in accordance with an embodiment of the present invention.

Here, in this state, the wafer mentioned above shows an outer appearance shown in FIGS. 8 and 9. A size of one of chips 21 formed within the wafer 2 is set, for example, such that a line thereof is about some mm to some tens mm, and some tens to some hundreds of electrode pads 211 are provided in each of them. In this case, a surface of each of the electrode pads 211 is normally formed in a rectangular shape having a line of some tens μm to a hundred and some tens μm. Further, the protective film on the surface is uniformly formed on the other circuit portion with avoiding an immediate upper portion of the electrode pad 211 at a thickness of normally about some to some tens μm.

The P-type and N-type forming process is structured such as to implant a B or P ion onto the wafer surface and later expand on the surface by a diffusion.

The device separating process is structured such as to form a Si oxide film on the surfaced mentioned above, apply a nitriding film patterning for selecting an area and selectively grow the oxide film in the portion which is not patterned, thereby respectively separating into fine devices.

The gate forming process is structured such as to form a gate oxide film having a thickness of some nm between the devices mentioned above, accumulate a poly Si on the upper portion in accordance with a CVD (Chemical Vapor Deposition) method and thereafter work in a predetermined size, thereby forming an electrode.

The source/drain forming process is structured such as to implant an ion of an impurity such as P, B and the like after forming the gate electrode and form a source/drain diffusion layer by an activated annealing.

The wiring process is structured such as to pile up Al wire, interlayer insulating films and the like, thereby electrically connecting each of the devices separated in the above process.

The protective film forming process corresponds to a process for preventing an impurity and a water from entering into the fine device formed in the manner mentioned above from the outer portion and reducing a mechanical stress when packaging the circuit later, and is structured such as to form a protective film on the circuit surface.

A wafer has a thickness of some hundreds μm and a diameter of about 4 inches to 8 inches, and 200 to 400 circuits are formed on the surface through the processes mentioned above, for example, in the case of DRAM (Dynamic Random Access Memory). A size of a circuit has a line of some to ten and some mm, and some tens to some hundreds of electrode pads are provided in a circuit. A surface of each of the electrode pads is formed in a rectangular shape having a line of some tens μm.

[Probing Test Process]

This process corresponds to a process for testing a conduction of an electric signal of each of the devices formed in the device forming process, and is normally performed by using the probe apparatus and bringing each of the probes into the electrode pad in the circuit one by one.

[Burn-in Test Process]

This process corresponds to a process for applying a thermal and electric stress to the circuit so as to select inferiority in an accelerative manner. The process brings each of the probes into contact with the electrode pad in the same manner as that of the probing test process.

Figure 1:
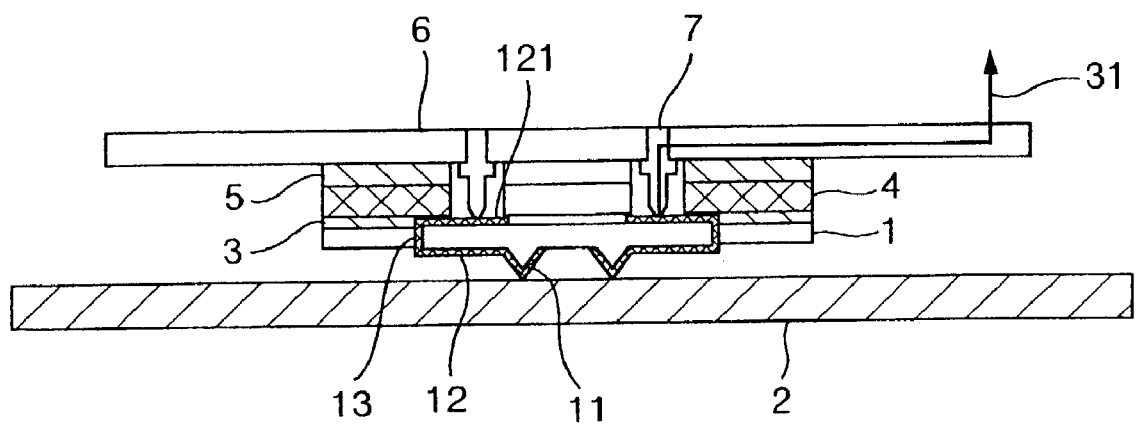
FIG. 1 is a schematic cross sectional view of a structure of a testing body in accordance with an embodiment of the present invention.

In this case, FIG. 1 is a schematic cross sectional view which shows a structure of a testing body used in the probing test process and the burn-in test process in accordance with the present invention. The first plate member 1 is structured such as to etch a single Si flat base plate and form a group of projections 11 on the surface facing to the body 2 to be tested.

Figure 11:
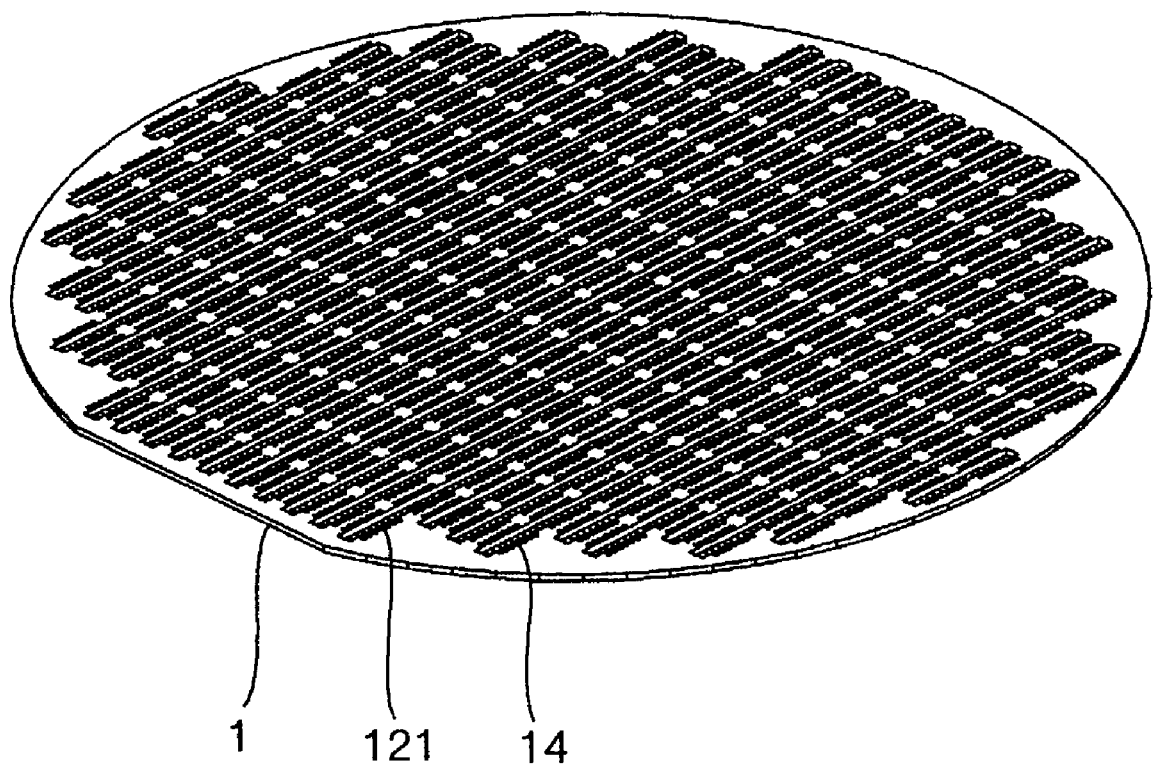
FIG. 11 is a schematic perspective view of a first plate member in accordance with an embodiment of the present invention as seen from a surface opposite to a projection forming surface.
Figure 12A:
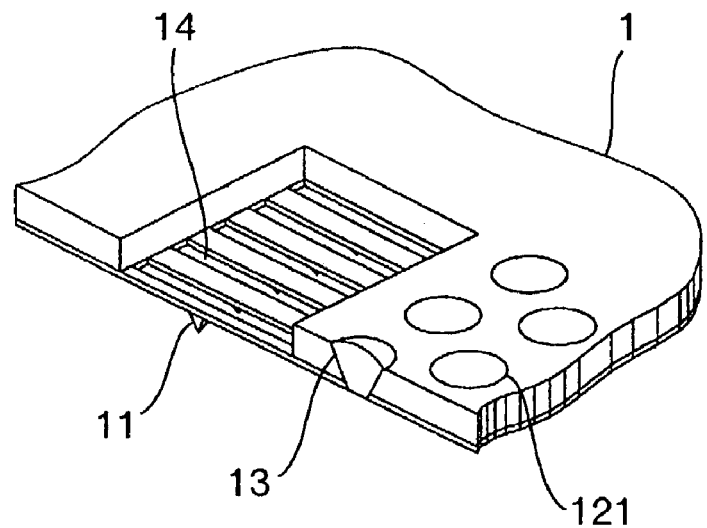
FIG. 12 is a partially detailed view of a conductor in accordance with an embodiment of the present invention.
Figure 12B:
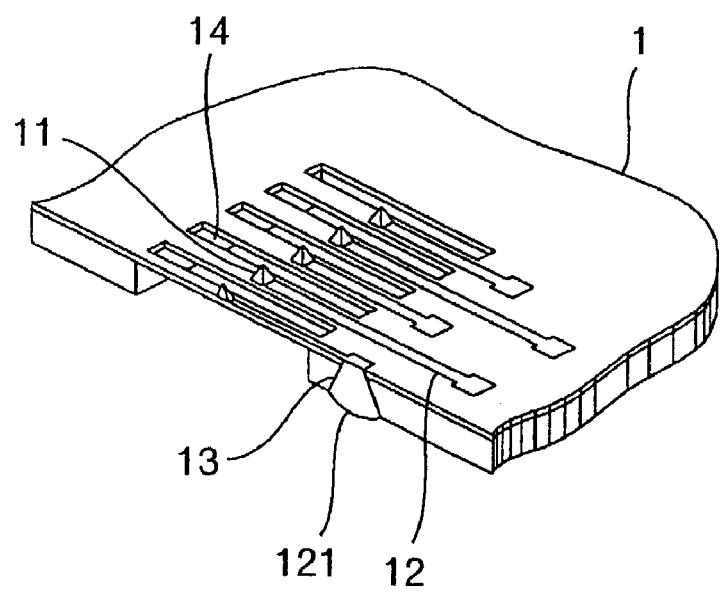

A structure of the first plate member 1 will be in detail described below with reference to FIGS. 11 and 12. FIG. 11 is a schematic perspective view of the first plate member 1 as seen from a surface opposite to the projection forming surface. Further, FIG. 12 is a partially enlarged and sectioned schematic perspective view for explaining each of the components of the contactor in detail, in which FIG. 12A is a view as seen from the same direction as that of FIG. 4 and FIG. 12B is a view as seen from the opposite surface. In each of FIGS. 11, 12A and 12B, in each of the first plate members 1, a weight-shaped projection 11 is formed at a position corresponding to the electrode pad of the wafer as the body to be tested.

The projection 11 is structured such as to form a conductive coat on a Si core integrated with the first plate obtained by, for example, anisotoropic etching Si in the periphery thereof.

In the tip of the group of the projections 11, a wire pattern 12 for obtaining a conduction between the body 2 to be tested and the outer portion is formed by using a wafer process technique, and the wire pattern 12 is electrically connected to a surface (hereinafter, refer to a back surface) opposite to the surface on which the group of projections 11 of the first plate member are formed via a through hole 13 provided in the first plate member 1. On the back surface of the first plate member 1, the insulating film 3 is provided except a pad 121 portion formed in the end portion of the wire pattern 12.

A third plate member 4 is bonded to the back surface of the first plate member 1. The third plate member 4 is used for the purpose of securing a flatness of the first plate member and reinforcing. Accordingly, it is desirable that it is constituted by a member having a sufficient rigidity capable of achieving the object mentioned above such as Si, AlN, metal, glass and the like and a size. Actually, a member having a Young's modulus of 60 GPa or more is desirable, and it is constituted by the member having a thickness of 100 μm or more. An elastomer 5 is provided on a back surface of the third plate member 4, and a second plate member 6 is provided on a further back surface thereof. Objects of the second plate member 6 are to obtain a conduction between the conductive structure 7 and the external test system, and to provide a sufficient rigidity necessary for pressing the test structure. Accordingly, there is generally used a glass epoxy multi-layer printed circuit board on which multi-layered conductive wires are developed. Further, in the case that it is expected that a whole great bending load is operated because a number of the probes is great, a load necessary for conducting is great, a probe forming area is wide or the like, the material may be set to have a rigidity higher than the metal and the ceramics. The elastomer 5 is used for the purpose of following the direction thereof to the body to be tested and reducing a load dispersion in accordance with a dispersion of a pressing amount between the body to be tested and the first plate member in the case that a main surface on which the group of projections 11 of the first plate member 1 are formed is relatively inclined with respect to the surface of the body to be tested. Accordingly, normally, an elastomer having a small Young's modulus, for example, showing a rubber elastic motion is employed. Otherwise, one or a plurality of coil springs or the like may be provided within the surface. The conductive structure 7 is used for achieving a conduction between the wire pattern 12 and the second plate member 6 in this case. For the conductive structure 7, for example, a contact probe with a fine spring corresponding to an adjacent pitch of 1.5 mm or less is used. Further, for the conductive structure 7, a conductive paste in which a metal powder such as a solder ball, Ag (silver) and the like corresponding to the fine pitch of 1.5 mm or less are mixed may be employed.

Further, for the first plate member 1, there may be employed a structure in which the group of projections 11 and the wire pattern 12 are formed by plating a conductor within an organic plate member surface such as a polyimide and the like in place of Si. An arrow 31 shows an embodiment of a conductive path.

Figure 3:
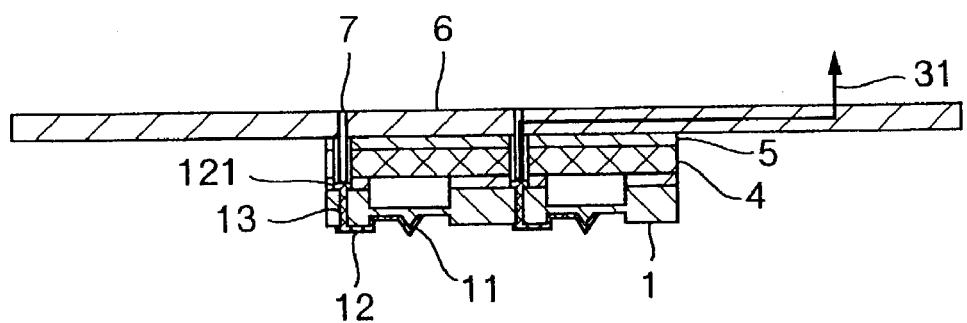
FIG. 3 is a schematic view of a structure of a testing body in accordance with the other embodiment of the present invention.
Figure 2A:
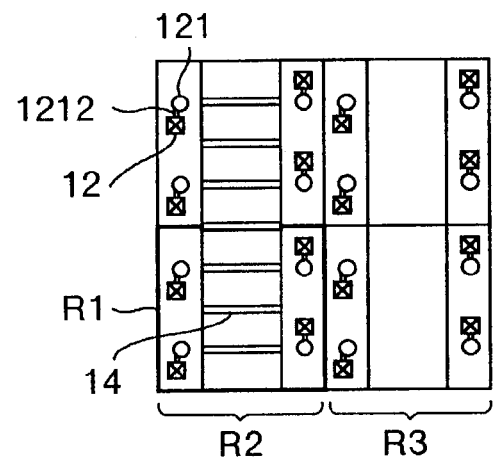
FIG. 2 is a schematic view of a structure of a testing body in accordance with another embodiment of the present invention.
Figure 2B:
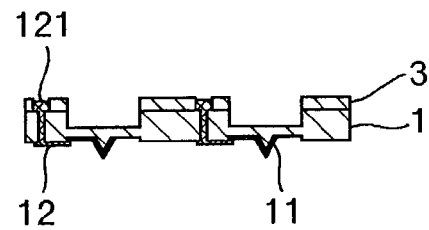
Figure 2C:
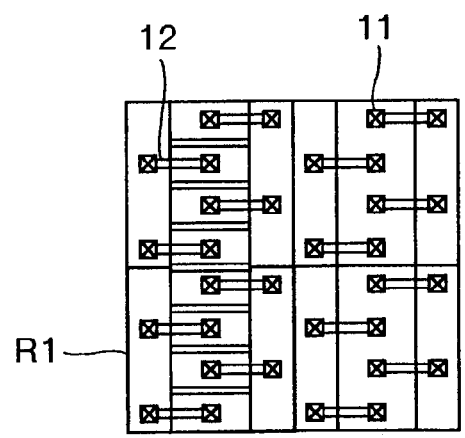

FIG. 2 shows a structure of a first plate member of a testing structure in accordance with another embodiment of the present invention, in which FIG. 2A is a top elevational view, FIG. 2B is a side elevational view and FIG. 2C is a bottom elevational view, respectively. In each of the figures, an area R1 corresponds to an area of a chip among the body to be tested. Further, an area R2 corresponding to two chips disposed in a left portion from a center corresponds to one in which a slit 14 passing through the first plate member 1 in a thickness direction is formed between the adjacent projections 11, as a result, each of the projections 11 is provided on an independent beam structure, and an area R3 corresponding to two chips in a right portion corresponds to an example where they are not provided. In any cases, as is apparent from FIG. 2B, a back surface of each of the projections 11 is structured such that the first plate member 1 is formed thin, for example, by etching, so that a space is formed above the beam structure. In the area R2, since there is the slit, each of the projections 11 can independently be bent at a time of pressing, so that a relative distance with respect to the corresponding electrode pad at each of the projections discontinuously changes due to a dispersion of a height of the projection and the electrode pad or a relative surface incline between the first plate member and the wafer. As a result, even in the case that an actual pressing amount of each of the projections changes, it is possible to independently conduct, respectively. The wire pattern 12 forms the pad 121 at a position different from a through portion on the back surface of the first plate member 1 after passing through the first plate member 1 in a thickness direction. When the structure is made in this manner, it is possible to make a pitch of arrangement of the pad 121 greater via a wire pattern 1212 on the back surface even in the case that the pitch of arrangement of the pad of the body to be tested and the corresponding projection are very small. When the pitch of the arrangement is enlarged in this manner, an electric connection between the pad 121 and the second plate member by the conductive structure can be made easy and inexpensive, and it is a necessary countermeasure for keeping a reliability of connection high. In this case, in accordance with a certain number of the formed pads, a certain arrangement aspect of the electrode pad of the wafer to be tested and the like, there is a case that the space for arranging the wire pattern 1212 on the back surface of the first plate member can not secured. In the case mentioned above, it is necessary to connect the conductive structure 7 on the back surface of the first plate member by setting the through hole portion as the pad 121 as it is after adjusting an interval of each of the through holes by an operation of the wire pattern 12 on the projection forming surface of the first plate member. FIG. 3 is a cross sectional view of a testing structure structured by employing the first plate member shown in FIG. 2.

Figure 4A:
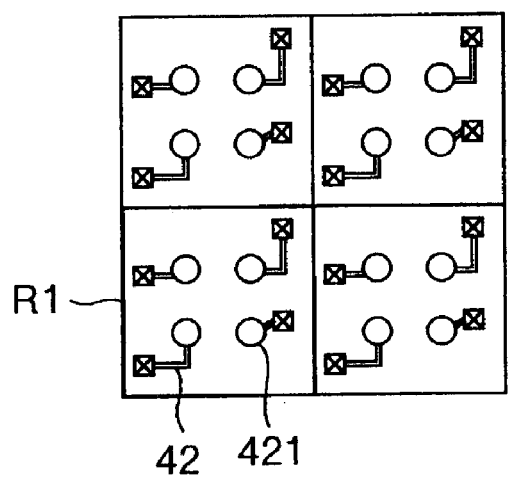
FIG. 4 is a schematic view of a structure of a testing body in accordance with further the other embodiment of the present invention.
Figure 4B:
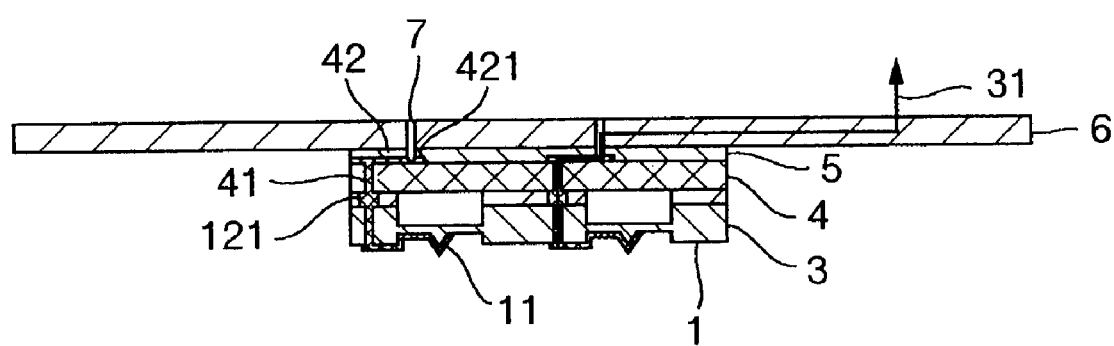

FIG. 4 shows a structure of a first plate member of a testing structured in accordance with further the other embodiment of the present invention, in which FIG. 4A is a top elevational view and FIG. 4B is a side elevational view, respectively.

In the present embodiment, as shown in FIG. 4B, a through hole 41 is provided in the third plate member 4 at a position corresponding to the pad 121 of the first plate member 1, and a wire pattern 42 is provided in a portion from a contact portion with the pad 121 to an upper surface of the third plate member 4. The wire pattern 42 constitutes a pad 421 at a position different from the through hole 41. Further, the conductive structure 7 connects the pad 421 of the third plate member to the second plate member 6.

In the present embodiment, since the wire pattern 42 is formed in the third plate member 4, a structure is made complex in comparison with the preceding embodiment (FIG. 3). However, in the preceding embodiment (FIG. 3), it is necessary to set the position of the pad brought into contact with the conductive structure 7 at a position except the beam structure portion etched thin, on the contrary, in accordance with the present embodiment, it is not necessary. Accordingly, even in the case that the number of the projections 11 is very large, it is possible to arrange them in an easy manner and at a high density due to an operation of an improvement of a redundancy of arranging the pad and an improvement of a freedom of a wire shape.

Further, in this case, it is necessary to connect the conductive structure to the through hole portion of the third plate member as it is in the case that the space for arranging the wire pattern 42 on the back surface of the third plate member can not secured due to the number of the formed pads, the arrangement aspect of the electrode pad of the wafer to be detected.

Figure 5A:
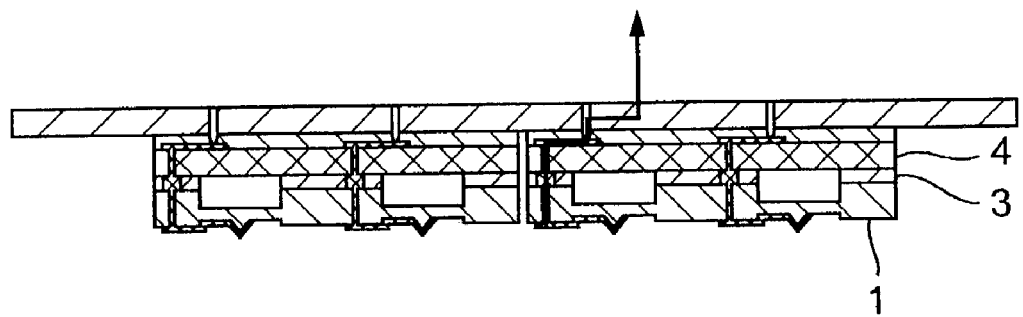
FIG. 5 is a schematic view of a structure of a testing body in accordance with further the other embodiment of the present invention.
Figure 5B:
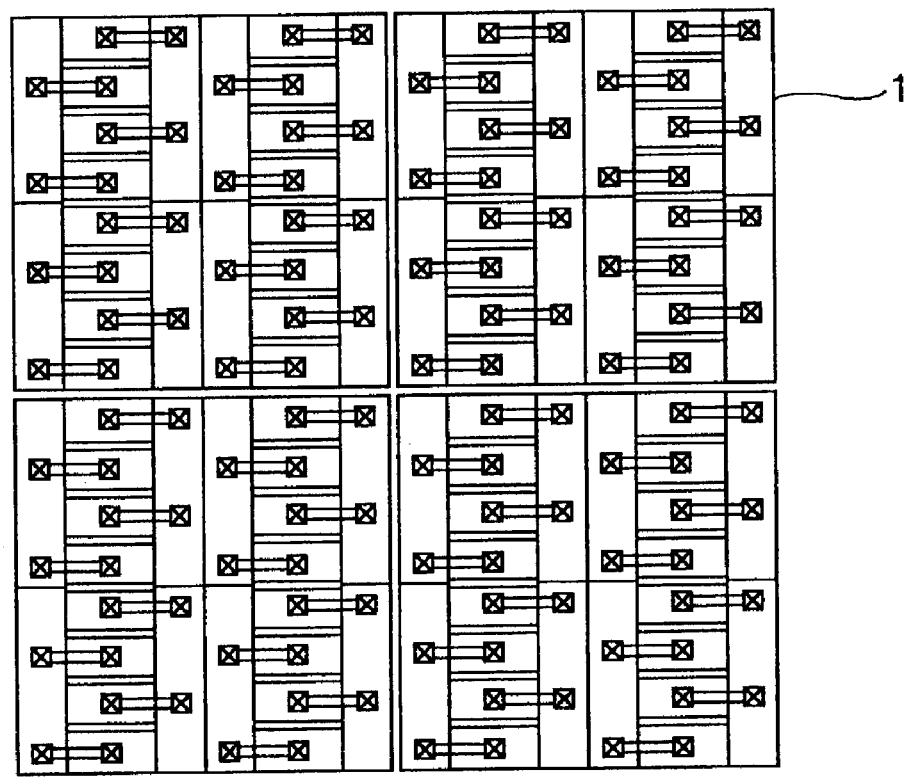

FIG. 5 shows a structure of a first plate member of a testing structure in accordance with further the other embodiment of the present invention, in which FIG. 5A is a cross sectional view and FIG. 5B is a bottom elevational view, respectively.

In accordance with the present embodiment, a plurality of first plate members 1 are substantially arranged within the same surface. This arrangement can be achieved by bonding the first plate members to the single third plate member 4 by an adhesive. However, a plurality of third plate members 4 may be present in correspondence to an actual size and a state of arrangement. This embodiment is employed in the case of testing a greater area such as a whole surface of the wafer to be tested or the like in a lump. This can be achieved, as mentioned above, by forming all of the conductive path from the pads to be tested and existing within a plane of projection of one of the first plate members within the first plate member.

In this case, since the conductive path of the pad (not shown) to be tested of the body to be tested and existing within the plane of projection of the first plate member is structured such that all of them are present within the plane of projection of the first plate member within the first plate member, the object of the present invention can be achieved.

Figure 6:
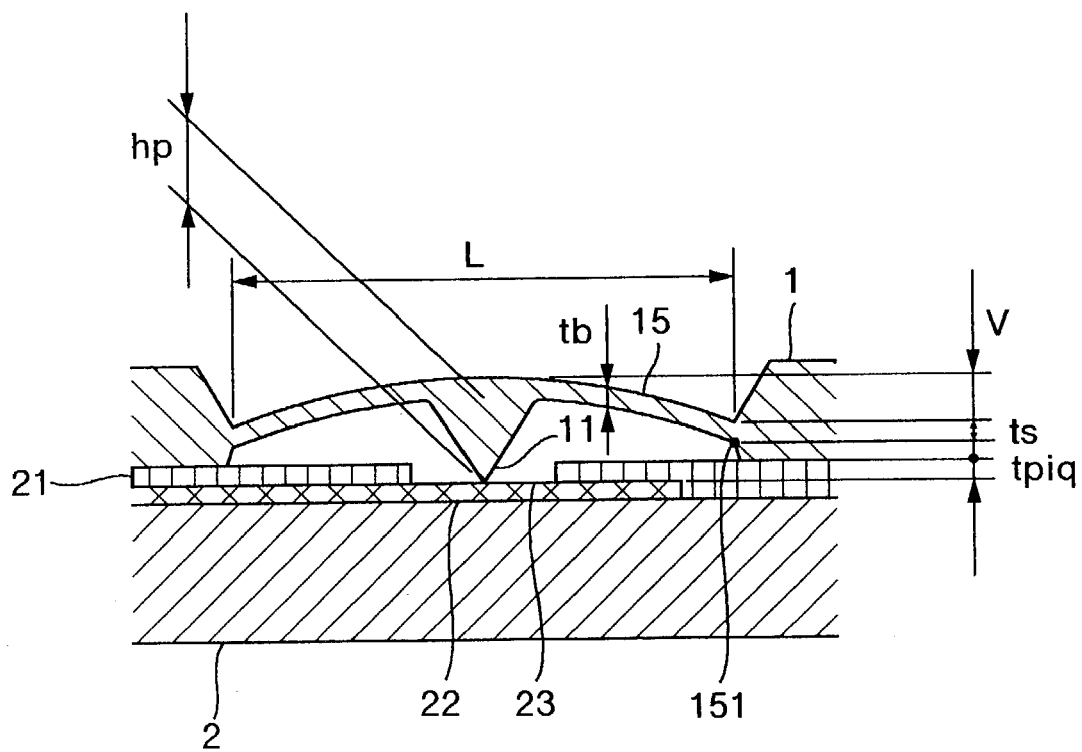
FIG. 6 is a schematic view of a structure of a testing body in accordance with further the other embodiment of the present invention.

FIG. 6 shows a state a testing structure in accordance with further the other embodiment of the present invention at a time of testing a body to be tested, and in particular corresponds to a cross sectional view of a portion near the body to be tested and the projection of the first plate member 1. In the present embodiment, there is shown a state that the first plate member 1 brings the back surface into contact with the protective film 21 of the body 2 to be tested and a difference of height of a contact position between the back surface of the first plate member 1 and the protective film 21 is absorbed by a deflection of the beam portion 15. An aspect of this testing method is important in view of uniformly controlling an Al film contact pressure of each of the projections in all around the area of the first plate member 1. That is, because it is possible to relatively cancel a variation of a load on the basis of a variation of a deflection v in the beam 15 generated due to a relative incline between the main surfaces of the first plate member 1 and the body to be tested which is unavoidably generated, an undulation within the surfaces of the both, an unevenness, a dispersion of the pressing amount of the body to be tested to the first plate member, by bringing the back surface of the first plate member 1 into contact with the protective film 21. Accordingly, the load which the projection 11 presses the Al film 22 can be controlled t a fixed value due to the deflection in the beam portion, so that a desired stable load amount can be always obtained only by making a material and a size of the beam proper. At this time, in the case of using Si for the first plate member 1, it is important in view of preventing the beam portion 15 from breaking to set a tensile stress acting on a lower end portion of the beam portion 15 to not over about 2 GPa ±1 GPa, and further, it is necessary to set the load acting on the tip of the projection to 1 gf or more in order to achieve a stable conduction. As a result of an experiment, it has been known to be effective that the beam size satisfying both conditions is set such that a length L is 0.8 to 2 mm, a thickness tp is 30 to 50 µm, a width is made in correspondence to a minimum pitch of a layout for the pad 23 of the body to be tested, a deflection v is 15 µm or less and a projection height hp is 20 to 40 µm in order to correspond them. Further, in the case of forming the beam portion with a high accuracy and in a uniform manner, it is possible to design so as to set the v value nearer the strength of Si, so that only in such a case, a shape of the beam portion may be a so-called cantilever beam. Accordingly, the L value can be reduced at this time, so that there can be obtained an advantage that each of the components can be arranged at a higher density.

Working the back surface of each of the projections thinner than the periphery thereof in the manner of the present embodiment is performed for the purpose of selectively bending the same portion in the first plate member at a time of pressing. This is an important countermeasure in view of removing a bad influence to the uniform pressing due to the relative surface incline unavoidably generated between the first plate member and the wafer or a warpage and a deflection of both of them without inviting a disadvantage that a significantly great excessive load in comparison with the pressing load required for the conduction corresponding to the primary object acts on the projection and the electrode pad, thereby damaging both of them.

Figure 7:
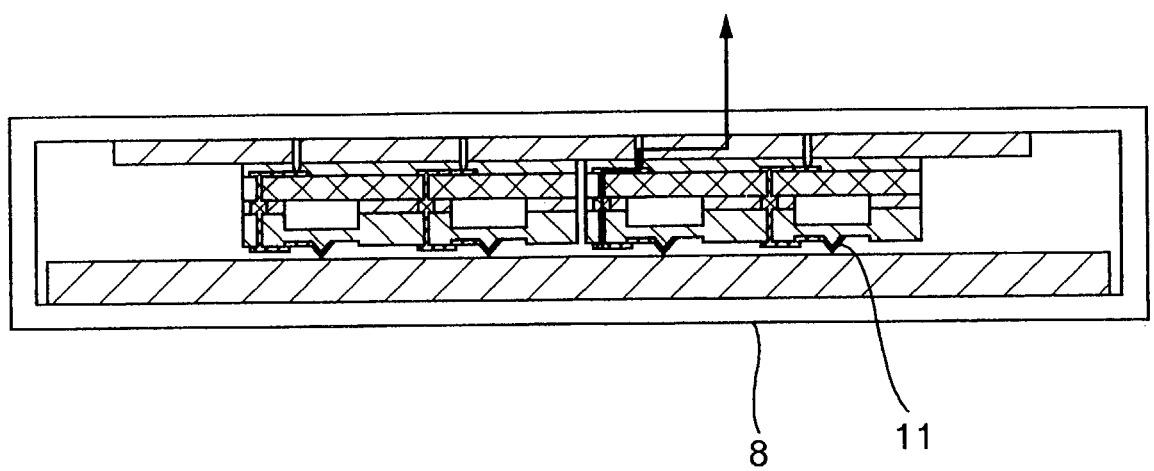
FIG. 7 is a schematic view of a structure of a testing body in accordance with further the other embodiment of the present invention.

FIG. 7 is a schematic cross sectional view of a testing structure in accordance with further the other embodiment of the present invention. The present embodiment is structured such that in a state of bringing the testing structure mentioned in FIG. 5 into contact with a desired position of the body to be tested, they are packed by a casing having a rigid structure. This shows an aspect for testing a large area in which the burn-in test mentioned above is performed, for example, all around the area of the wafer in a lump. Packing in this manner is performed for the purpose of giving a mobility with accurately pressing, so that it is possible to apply a burn-in test to a multiplicity of wafers in a lump by conveying a plurality of the testing structures in this state into an electric heating furnace in a lump and applying a desired high temperature state.

In accordance with the present invention, in an electric characteristic testing process corresponding to a process of the semiconductor apparatus manufacturing processes, it is possible to test a large area of the electrode pad of the body to be tested in a lump.

What is claimed is:

1. A test apparatus of a semiconductor apparatus, comprising:
  a substrate provided with a projection formed on one main surface of said substrate so as to be electrically connectable to an electrode of a tested semiconductor apparatus, wherein said substrate is made of silicon;
  a pad formed on a back surface side of said one main surface; and
  a conductive member electrically connecting said projection and said pad,
  wherein a region of said substrate where the projection is formed is deformed more easily than a region apart therefrom.

2. A test apparatus of a semiconductor apparatus according to claim 1, wherein a substrate thickness of the region where said projection is formed is thinner than a substrate thickness of a region apart therefrom.

3. A test apparatus of a semiconductor apparatus according to claim 1, wherein a number of tested conductor portions formed in a tested range of said substrate of said tested semiconductor apparatus is equal to a number of said projections which are formed in said substrate of said test apparatus and electrically independent.

4. A test apparatus of a semiconductor apparatus according to claim 1, wherein said substrate is provided with a plurality of said projections, and a through groove crossing a line connecting two adjacent projections is formed in said substrate.

5. A test apparatus of a semiconductor apparatus according to claim 1, wherein said one main surface of said substrate is provided with a region which is in contact with said tested semiconductor apparatus, in addition to said projection being in contact with said tested semiconductor apparatus, at a time of testing said tested semiconductor apparatus.

6. A test apparatus of a semiconductor apparatus according to claim 2, wherein said region of said substrate where the projection is formed is constituted by a beam.

7. A test apparatus of a semiconductor apparatus, comprising:
  a substrate provided with a projection formed on one main surface of said substrate so as to be electrically connectable to an electrode of a tested semiconductor apparatus;
  a pad formed on a back surface side of said one main surface; and
  a conductive member electrically connecting said projection and said pad,
  wherein a region of said substrate where the projection is formed is deformed more easily than a region apart therefrom; and further comprising:
  a second plate member arranged so as to oppose to the surface of said substrate where the pad is formed, and provided with a wire electrically communicated with said pad; and
  a third plate member arranged between said substrate and said second plate member,
  wherein said third plate member is formed of a material having a Young's modulus of 60 GPa or more, and has a thickness of 100 µm or more.

8. A test apparatus of a semiconductor apparatus, comprising:
  a substrate provided with a projection formed on one main surface of said substrate so as to be electrically connectable to an electrode of a tested semiconductor apparatus, wherein said substrate is made of silicon;
  a pad formed on a back surface side of said one main surface; and
  a conductive member electrically connecting said projection and said pad,
  wherein a region of said substrate where the projection is formed is deformed more easily than a region apart therefrom; and
  further comprising:
  a second plate member arranged so as to oppose to the surface of said substrate where the pad is formed, and provided with a wire electrically communicated with said pad; and
  a third plate member arranged between said substrate and said second plate member,
  wherein said third plate member is formed of a material having a Young's modulus of 60 GPa or more, and has a thickness of 100 µm or more.

9. A test apparatus of a semiconductor apparatus according to claim 8, wherein said projection and said third plate member are arranged via a space.

10. A test apparatus of a semiconductor apparatus, comprising:
- a substrate provided with a projection formed on one main surface of said substrate so as to be electrically connectable to an electrode of a tested semiconductor apparatus, wherein said substrate is made of silicon;
- a pad formed on a back surface side of said one main surface; and
- a conductive member electrically connecting said projection and said pad,
- wherein a region of said substrate where the projection is formed is deformed more easily than a region apart therefrom, and
- wherein a plurality of said substrates are provided substantially within one surface.

11. A test apparatus of a semiconductor apparatus, comprising:
- a substrate provided with a projection formed on one main surface of said substrate so as to be electrically connectable to an electrode of a tested semiconductor apparatus, wherein said substrate is made of silicon, and wherein said projection is made of silicon integrated with said substrate, and has a conductive coat thereon;
- a pad formed on a back surface side of said one main surface; and
- a conductive member electrically connecting said projection and said pad,
- wherein a region of said substrate where the projection is formed is deformed more easily than a region apart therefrom.

* * * * *